United States Patent
deBlanc et al.

(10) Patent No.: US 7,260,358 B2
(45) Date of Patent: Aug. 21, 2007

(54) DATA-STORAGE SYSTEM HAVING A WIRELESS CONNECTION ARCHITECTURE FOR WIRELESS DATA EXCHANGE BETWEEN MODULES

(75) Inventors: James J deBlanc, Roseville, CA (US); Anthony J Benson, Roseville, CA (US); James L White, Roseville, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 631 days.

(21) Appl. No.: 10/458,250

(22) Filed: Jun. 11, 2003

(65) Prior Publication Data

US 2004/0253922 A1   Dec. 16, 2004

(51) Int. Cl.
*H04B 7/00* (2006.01)

(52) U.S. Cl. .............. 455/41.2; 455/414.1; 455/575.7; 455/556.1; 358/426.08; 358/434; 345/169; 235/375; 235/385

(58) Field of Classification Search ............. 455/575.7, 455/41.1, 556.1, 414.1, 41.2; 358/426.08; 358/434; 345/169, 168
See application file for complete search history.

(56) References Cited

U.S. PATENT DOCUMENTS

| | | | | |
|---|---|---|---|---|
| 5,535,338 | A * | 7/1996 | Krause et al. | 709/222 |
| 6,073,855 | A * | 6/2000 | MacKenthun | 235/492 |
| 6,118,986 | A * | 9/2000 | Harris et al. | 455/575.3 |
| 6,164,531 | A * | 12/2000 | Harris et al. | 235/380 |
| 6,557,049 | B1 * | 4/2003 | Maloy et al. | 710/8 |
| 6,697,415 | B1 * | 2/2004 | Mahany | 375/130 |
| 6,717,801 | B1 * | 4/2004 | Castell et al. | 361/683 |
| 6,724,730 | B1 * | 4/2004 | Mlinarsky et al. | 370/241 |
| 6,801,787 | B1 * | 10/2004 | Page et al. | 455/556.1 |
| 7,032,037 | B2 * | 4/2006 | Garnett et al. | 710/2 |

* cited by examiner

*Primary Examiner*—Marceau Milord

(57) ABSTRACT

A connection architecture for a data-storage system may include: a connection-plane structure; a data-storage module attached to, and drawing power from, the connection-plane structure; an input/output (I/O) module attached to, and drawing power from, the connection-plane structure; and wireless means for exchanging data wirelessly between the data-storage module and the I/O module.

26 Claims, 2 Drawing Sheets

DATA-STORAGE SYSTEM HAVING A WIRELESS CONNECTION ARCHITECTURE FOR WIRELESS DATA EXCHANGE BETWEEN MODULES

BACKGROUND OF THE INVENTION

A perpetual goal in digital circuitry is to maintain pulse fidelity and minimize settling time. For digital circuitry exchanging high-speed data, e.g., such as with the Fibre Channel standard, it is increasingly the case that even circuit traces of short lengths are a significant fraction of a wavelength long. In order to get a clean transient response for the high-speed data, such short traces and the nearby ground planes are treated as transmission lines whose impedances should be matched to the circuitry and/or to a standardized nominal value.

Depending on the type of digital circuitry and the needs of the circumstances to which the transmission lines are applied, a variety of techniques may be employed to achieve an impedance match or a nominal impedance. These include damping resistors, source end series termination, load-end termination, distributed loading, etc.

Such high-speed signals place the greatest demand upon a connection-plane structure, e.g., a midplane or backplane, to which data-handling units connect. A midplane is a PCB designed to interconnect other PCBs (daughter cards) or modules (such as power supplies or disk drives). It is typically positioned in a product such that other boards or modules may connect from either side (front or back). In contrast, a backplane provides the same type of functionality, but typically only accepts boards or modules from one side. Examples of a data-handling unit include: data-storage modules, input/output (I/O) modules, power supply modules, cooling (such as fan or blower) modules and other field replaceable units (FRUs).

The connection-plane structure mechanically supports the data-handling units that are mechanically-connected to it. The connection-plane structure also provides electrical signal paths (formed of conductors or traces) between data-handling units by which high-speed data can be exchanged. Power can be drawn from the connection-plane structure. Status and/or control signals can be exchanged with a data-handling unit via the connection-plane structure. Alternatively, the electrical signal paths between data-handling units can be provided via a cable harness.

When taking the form of the connection-plane structure or a cable harness having a matched and/or nominal impedance, electrical signal paths between data handling units introduce significant costs and add significant complexity to a system.

SUMMARY OF THE INVENTION

One of the embodiments of the invention is directed to a connection architecture for a data-storage system. Such a connection architecture may include: a connection-plane structure; a data-storage module attached to, and drawing power from, the connection-plane structure; an input/output (I/O) module attached to, and drawing power from, the connection-plane structure; and wireless means for exchanging data wirelessly between the data-storage module and the I/O module.

Another of the embodiments of the invention is directed to another connection architecture for a data-storage system. Such connection architecture may include: a connection-plane structure; a data-storage module attached to the connection-plane structure; a first wireless transceiver operable to transmit data between the data-storage module and a second wireless transceiver unit; an input/output (I/O) module attached to the connection-plane structure; and the second wireless transceiver, which is operable to transmit data between the I/O module and the first wireless transceiver unit.

Another of the embodiments of the invention is directed to an intra-enclosure-wireless connection arrangement for a data-storage system. Such an intra-enclosure-wireless connection arrangement may include: an enclosure; a data-storage module provided within the enclosure; an input/output (I/O) module provided within the enclosure; and wireless means for intra-enclosure wireless exchange of data between the data-storage module and the I/O module.

Another of the embodiments of the invention is directed to another intra-enclosure-wireless connection arrangement for a data-storage system. Such an intra-enclosure-wireless connection arrangement may include: an enclosure; a data-storage module provided within the enclosure; a first wireless transceiver operable for intra-enclosure wireless exchange of data between the data-storage module and a second wireless transceiver unit; an input/output (I/O) module provided within the enclosure; and the second wireless transceiver, which is operable for intra-enclosure wireless exchange of data between the I/O module and the first wireless transceiver unit.

Another of the embodiments of the invention is directed to an intra-enclosure-wireless and inter-enclosure-wireless connection arrangement for a data-storage system. Such a wireless connection arrangement may include: a first data-storage block; a second data-storage block; a cabinet that encloses the first and second data-storage blocks; third wireless means; and fourth wireless means. The first data-storage block may include: a first enclosure, first data-storage means provided within the first enclosure, first input/output (I/O) means provided within the first enclosure, and first wireless means for intra-first-enclosure wireless exchange of data between the first data-storage means and the first I/O means. The second data-storage block may include: a second enclosure, second data-storage means provided within the second enclosure, second input/output (I/O) means provided within the second enclosure, and second wireless means for intra-second-enclosure wireless exchange of data between the second data-storage means and the second I/O means. The third wireless means is provided within the cabinet and is operable for intra-cabinet albeit inter-enclosure wireless exchange of data between the first I/O means and third I/O means. The fourth wireless means is provided within the cabinet and is operable for intra-cabinet albeit inter-enclosure wireless exchange of data between the second I/O means and the third I/O means. The third I/O means is operable to exchange data between an entity external to the first and second data-storage blocks and at least one of the third wireless means and the fourth wireless means.

Additional features and advantages of the invention will be more fully apparent from the following detailed description of example embodiments and the accompanying drawings.

The accompanying drawings are: intended to depict example embodiments of the invention and should not be interpreted to limit the scope thereof; and not to be considered as drawn to scale unless explicitly noted.

DETAILED DESCRIPTION OF THE PREFERRED EMBODIMENTS

An embodiment of the invention is the recognition of the following. The medium of exchange of high-speed data between data-handling units need not be solely via signal paths that are formed primarily of metallic conductors, e.g., traces on connection-plane structures and/or cable harnesses. Other media, e.g., air (representing the communication channel for wireless technology), can be used as the medium of exchange. Using such a wireless medium would eliminate the need for many of the traces otherwise present on a connection-plane structure, which would, e.g., eliminate significant cost and complexity in a connection-plane structure otherwise associated with traces that are impedance-matched transmission-lines, free otherwise-consumed space on the connection-plane structure that could then be used to accommodate connections for additional data-handling units, etc. In addition, a customer's equipment could be upgraded in the field to the latest high-speed wireless technology without necessarily replacing the connection-plane structure (typically not a field-replaceable-unit (FRU)).

Figure 1:
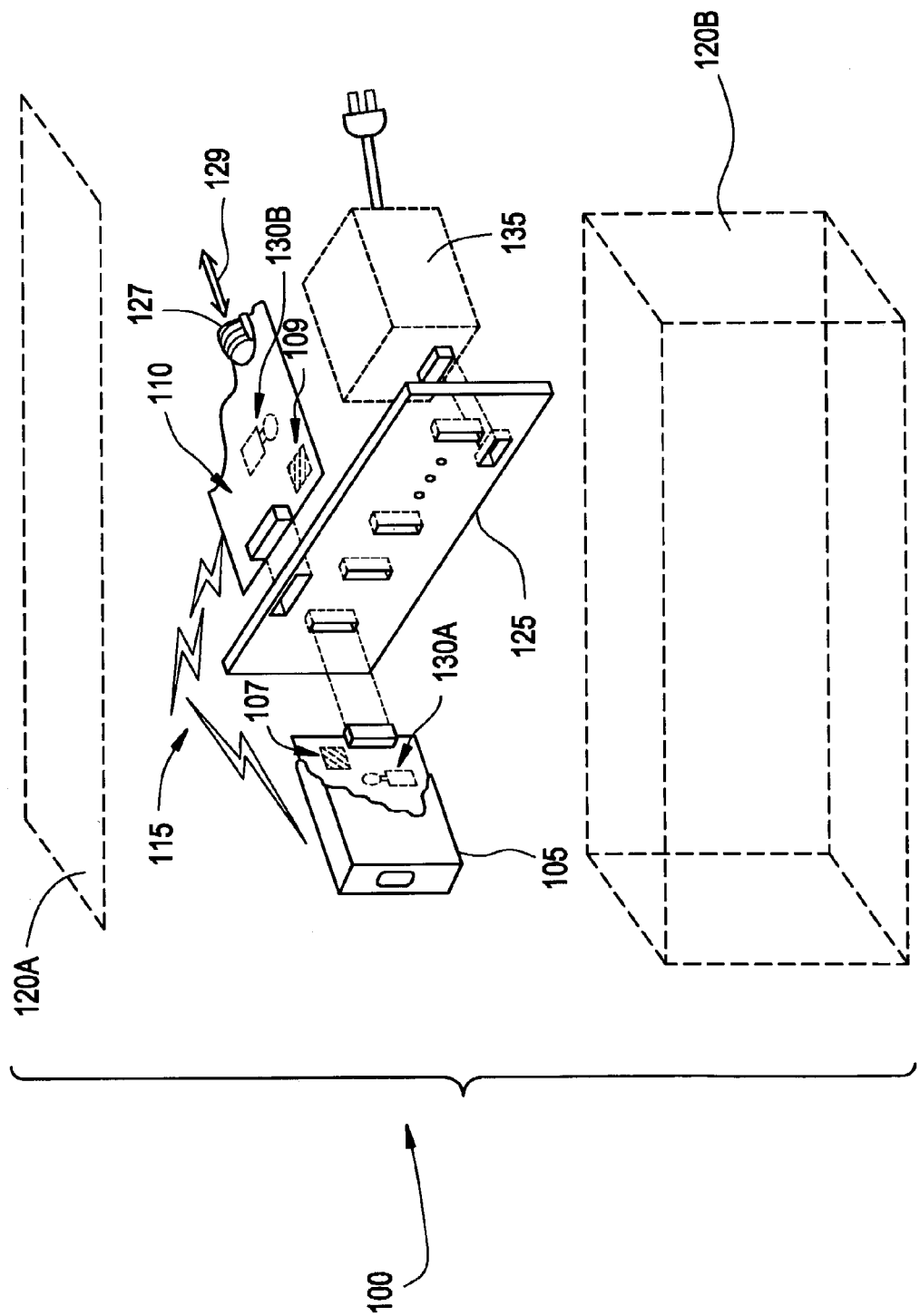
FIG. 1 is a three-quarter perspective diagram of a connection architecture for a data-storage system according to an embodiment of the invention.

FIG. 1 is a three-quarter perspective diagram of a connection architecture for a data-storage system 100 according to an embodiment of the invention. A data-storage system 100 of FIG. 1 includes a first data-handling unit 105, a second data-handling unit 110, an optional wireless transceiver 107 (discussed below) and an optional wireless transceiver 109 (discussed below).

Many devices can be considered examples of data-handling units 105 and 110, respectively, e.g., particularly those devices that are common to the computer environment, such as I/O modules and data-storage modules. The data-handling units 105 and/or 110 can also include one or more peripherals such as sound cards, modems, and other devices. Component 105 need not be the same type of data-handling device as component 110. One skilled in the appropriate art will realize the aforementioned examples of data-handling units do not constitute an exhaustive list.

As an example for the purposes of discussion, consider the data-handling unit 105 to be a data-storage module and the data-handling unit 110 to be an I/O module. Accordingly, to further the example, the I/O module 110 is provided with a connector 127 for connection (as indicated by the bi-directional arrow 129) to a, e.g., a host (such as storage-consuming components and/or a storage manager application on a storage area network) by which data (e.g., high-speed data) and, optionally, status and/or control signals can be exchanged. A data-storage module 105 can be a JBOD, a RAID, some other type of disk-drive-based memory device, a tape-based memory device, a solid-state memory device, a combination of such devices, etc.

The first data-handling unit 105 and the second data-handling unit 110 can be coupled by a wireless link 115. The wireless link 115 may be a communications path between communication devices that allows transfer of data through an air channel. According to one embodiment of the invention, the capability to provide and utilize the wireless link 115 is integral to the first data-handling unit 105 and the second data-handling unit 110; hence, the units 107 and 109 would not be considered as discrete units in this embodiment.

Signals representing data (e.g., high-speed data) are exchanged via the wireless link 115. Here, applying the label "high-speed" to a signal defines the signal as having a ratio of rise-time to length of the communication path (or propagation delay to traverse the communication path between the data-storage module and the I/O module) that is sufficiently high to merit, if the communication path otherwise was formed substantially of metallic conductors, using impedance-matched transmission lines as the metallic conductors. While well-suited to the exchange of high-speed data, embodiments of the invention can also be used to exchange data that does not meet the definition of high-speed data, i.e., the embodiments of the invention are not limited to wirelessly exchanging only high-speed signals.

The types of wireless communication protocols that can be used include industry standards, an example of which is 802.11a. This is an IEEE standard that details wireless networking (Ethernet). The IEEE standard 802.11a may support the transmission of 54 Mbps per channel for short distances. If needed, multiple channels of this wireless LAN (WLAN) can be aggregated to increase the data throughput.

Any data-handling unit 105 and/or 110 of the data-storage system 100 can receive data or transmit data (or both) to any other data-handling unit in the system 100 without the need for signal paths that are formed primarily of metallic conductors, e.g., traces on connection-plane structures and/or cable harnesses. The wire-formed (or trace-formed) portion of the signal paths for each data-handling unit can end at a wireless transceiver. The data is then encoded/modulated/translated onto/into. e.g., an RF signal (or other suitable wireless signal) and then transmitted wirelessly off the module, and vice-versa. As such, communicating wirelessly is herein defined as communicating via a signal path at least a portion of which does not employ electrically conducting media such as discrete electrical conductors (e.g., metal wires and/or traces). One or more non-conducting substances can be present between a transmitter and receiver (e.g., air, water, packaging material, plastics, etc.) as well as no substance at all (vacuum). A wirelessly communicated signal can pass through each of these, hence each can form part of the wireless signal path.

The system 100 can further include a connection-plane structure, e.g., a midplane, 125. The midplane 125 mechanically supports the devices, e.g., the data-storage module 105 and the I/O module 110, that are mechanically-connected to it. Power can be drawn from the midplane 125 (making it an active, as opposed to a passive, midplane). The midplane 125 can also provide electrical signal paths (formed of conductors or traces) between the devices connected to it by which status and/or control signals can be exchanged. Alternatively, the status and/or control signals can also be exchanged via the wireless link 115. Further in the alternative, the power, status and/or control signal paths between the data-handling units mechanically connected to the midplane 125 can be provided via a cable harness or some other signal-distribution scheme. Where the connection-plane structure 125 provides only mechanical support, it is better described as a rack. The midplane 125 may have other components connected to it, e.g., a power supply module 135, as well as associated PCB traces.

The system 100 can further include an optional enclosure that encloses the components 105 and 110 and (if present) the optional devices (discussed below) 109 and 107. Such an enclosure is represented in FIG. 1 as optional enclosure top 120A and optional enclosure bottom 120B, both of which are shown in phantom lines. When the enclosure is present and is made of an EMI-shielding material, the wireless link 115 can be described as an intra-enclosure wireless link. Since the data-storage module 105 and the I/O module 110 are typically in very close proximity, the power of the wirelessly-transmitted signals can be set to low levels (e.g., lower than devices that need to communicate over distances of 10 to 20 feet). Hence, the enclosure is considered optional because it need not be present to contain EMI from the wireless link 115.

According to another embodiment of the invention, wireless communication capability is not integral to the first and second data-handling units 105 and 110. Rather, the first and second data-handling units 105 and 110 are provided with wireless transceivers 107 and 109, respectively, which are shown in phantom lines in FIG. 1 to help call attention to their status as being part of one of multiple embodiments. As such, the wireless transceivers 107 and 109 can: be referred to as optional; and provide the wireless link 115. An example of a commercially available device suitable for communications device 107 and/or 109 is the model named PRISM GT 2 CHIP WLAN SOLUTION made available by the INTERSIL CORP, which can exchange data 11 Mbps with an RF carrier of 2.4 GHz. This is not a limitation to the communication devices that may be utilized.

Other wireless air-channel communication technology may be used. Though many embodiments can utilize bi-directional data flow, unidirectional data flow could be utilized for tasks such as a status function that locally transmits enclosure status, without a need for a reply in other embodiments.

By providing the wireless link 115, data-handling modules, e.g., 105 and/110 can be designed to invoke wireless cross-bar switching functions that could increase the total system bandwidth (even if the individual wireless channels are slower than current wired protocol speeds).

Another embodiment according to the invention assumes that the optional wireless communication units 107 and 109 use optional PCB-type antennas 130A and 130B, respectively, which are depicted in phantom lines.

Figure 2:
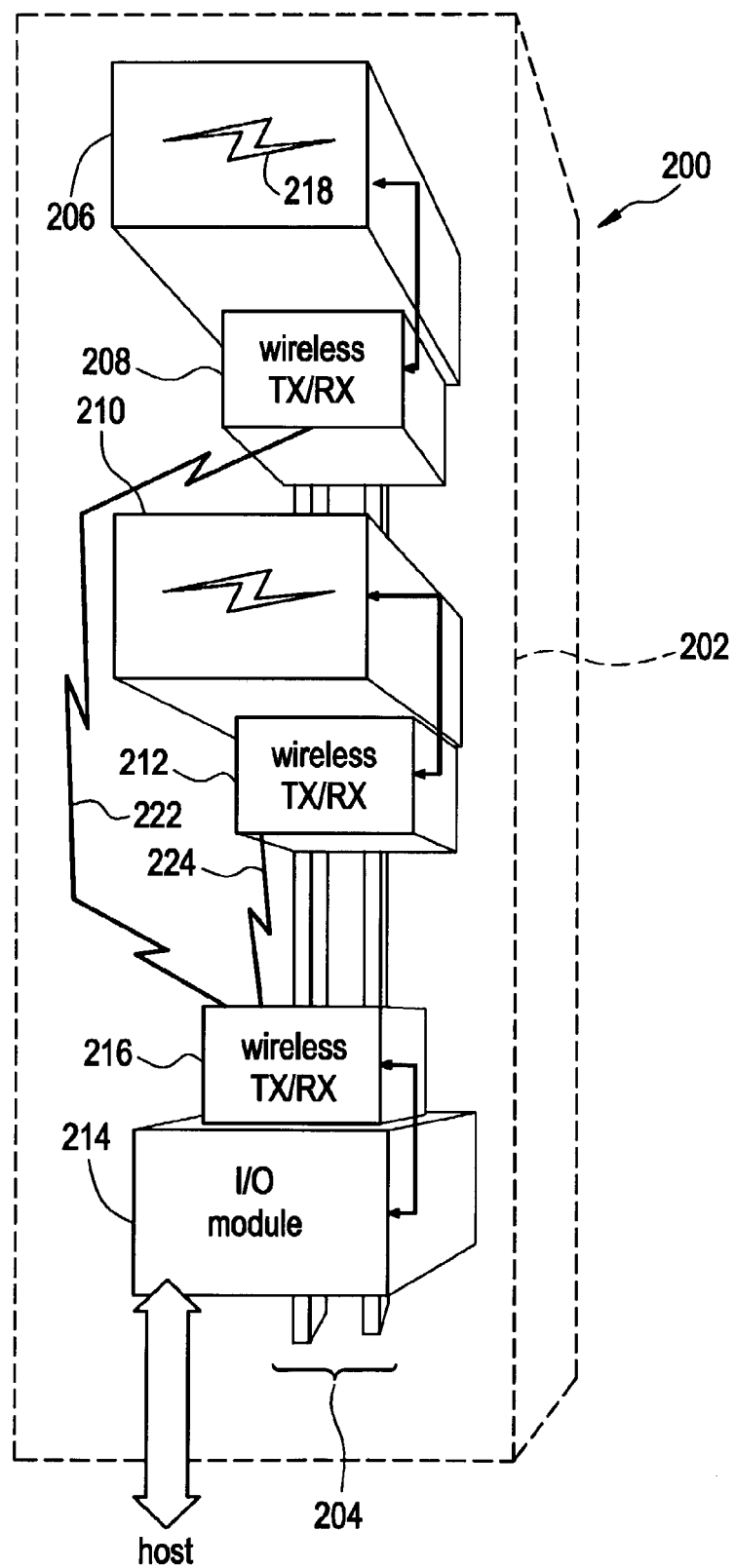
FIG. 2 is a three-quarter perspective diagram of wireless arrangement for a data-storage system according to an embodiment of the invention.

FIG. 2 is a three-quarter perspective diagram of wireless arrangement for a data-storage system 200 according to another embodiment of the invention. The system 200 includes first and second data-storage blocks 206 and 210 attached to a rack 204. Each of the data-storage blocks 206 and 210 can be similar to the system 100; it is noted that each should include an EMI-shielding enclosure. Accordingly, the data-storage block 206 can exhibit intra-enclosure wireless data exchange 218 and the data-storage block 210 separately can exhibit intra-enclosure wireless data exchange 220.

Components within the data-storage blocks 206 and 210 are not shown in FIG. 2 for simplicity. But it should be understood that the intra-enclosure wireless data exchange 218 is between a first data-storage module and a first I/O module via first wireless transceiving equipment (a set of wireless transceivers), and the intra-enclosure wireless data exchange 220 is between a second data-storage module and a second I/O module via wireless transceiving equipment (another set of wireless transceivers).

The system 200 further includes third and fourth wireless transceivers 208 and 212 by which the first and second data-storage blocks communicate wirelessly (as depicted via wireless symbols 222 and 224), respectively, via a fifth wireless transceiver 216 with a third I/O module 214.

The system 200 can further include an optional cabinet 202 (depicted in phantom lines) that encloses the components 204-216. When the cabinet is present and is made of an EMI-shielding material, the wireless links 222 and 224 can be described as intra-cabinet, albeit inter-enclosure, wireless links. Since the data-storage blocks 206 and 210 as well as the third I/O module 214 are typically in very close proximity, the power of the wirelessly-transmitted signals can be set to low levels. Hence, the enclosure is considered optional because it need not be present to contain EMI from the wireless link 115.

Alternatively, accordingly to another embodiment of the invention, the wireless link(s) 115, 218, 220, 222 and/or 224 may be done optically through the air-channel, e.g., at infra red wavelengths.

The invention being thus described, it will be obvious that the same may be varied in many ways. Such variations are not to be regarded as a departure from the spirit and scope of the invention, and all such modifications as would be obvious to one skilled in the art are intended to be included within the invention's scope.

What is claimed is:

1. A connection architecture for a data-storage system, the architecture comprising:
   a connection-plane structure;
   a data-storage module attached to, and drawing power from, the connection-plane structure;
   an input/output (I/O) module attached to, and drawing power from, the connection-plane structure; and
   wireless means for exchanging data wirelessly between the data-storage module and the I/O module.

2. The architecture of claim 1, wherein the data are in the form of high-speed signals having sufficiently high speed to otherwise merit, it the communication path between the data-storage module and the I/O module was formed substantially of metallic conductors, using impedance-matched transmission lines as the metallic conductors.

3. The architecture of claim 1, wherein the wireless means is operable to also wirelessly exchange at least one of status and control signals between the data-storage module and the I/O module.

4. The architecture of claim 1, wherein the connection-plane structure is a midplane.

5. The architecture of claim 1, wherein the data-storage unit includes at least one of a disk-drive-based memory device; a tape-based memory device and a solid-state-based memory device.

6. A connection architecture for a data-storage system, the architecture comprising:
   a connection-plane structure;
   a data-storage module attached to the connection-plane structure;
   a first wireless transceiver operable to transmit data between the data-storage module and a second wireless transceiver unit;
   an input/output (I/O) module attached to the connection-plane structure; and
   the second wireless transceiver, which is operable to transmit data between the I/O module and the first wireless transceiver unit.

7. The architecture of claim 6, wherein the data are in the form of high-speed signals having sufficiently high speed to otherwise merit, if the communication path between the data-storage module and the I/O module was formed substantially of metallic conductors, using impedance-matched transmission lines as the metallic conductors.

8. The architecture of claim 6, wherein:
the first wireless transceiver is operable to also wirelessly exchange at least one of status and control signals between the data-storage module and the second wireless transceiver; and
the second wireless transceivers is operable to also wirelessly exchange at least one of status and control signals between the I/O module and the first wireless transceiver.

9. The architecture of claim 6, wherein the connection-plane structure is one of: a midplane through which power can be drawn; and a rack.

10. The architecture of claim 6, wherein the data-storage unit includes at least one of a disk-drive-based memory device; a tape-based memory device and a solid-state-based memory device.

11. The architecture of claim 6, wherein each transceiver includes a PCB-type antenna.

12. An intra-enclosure-wireless connection arrangement for a data-storage system, the arrangement comprising:
an enclosure;
a data-storage module provided within the enclosure;
an input/output (I/O) module provided within the enclosure; and
wireless means for intra-enclosure wireless exchange of data between the data-storage module and the I/O module.

13. The arrangement of claim 12, wherein the data are in the form of high-speed signals having sufficiently high speed to otherwise merit, if the communication path between the data-storage module and the I/O module was formed substantially of metallic conductors, using impedance-matched transmission lines as the metallic conductors.

14. The arrangement of claim 12, wherein the wireless means is operable to also wirelessly exchange at least one of status and control signals between the data-storage module and the I/O module.

15. The arrangement of claim 12, wherein the enclosure is an EMI-shielding type of enclosure.

16. The arrangement of claim 12, further comprising:
a power supply module; and
a cable harness connecting, and supplying power, to the data-storage module and the I/O module, respectively.

17. The arrangement of claim 12, wherein the data-storage unit includes at least one of a disk-drive-based memory device; a tape-based memory device and a solid-state-based memory device.

18. An intra-enclosure-wireless connection arrangement for a data-storage system, the arrangement comprising:
an enclosure;
a data-storage module provided within the enclosure;
a first wireless transceiver operable for intra-enclosure wireless exchange of data between the data-storage module and a second wireless transceiver unit;
an input/output (I/O) module provided within the enclosure; and
the second wireless transceiver, which is operable for intra-enclosure wireless exchange of data between the I/O module and the first wireless transceiver unit.

19. The arrangement of claim 18, wherein the data are in the form of high-speed signals having sufficiently high speed to otherwise merit, if the communication path between the data-storage module and the I/O module was formed substantially of metallic conductors, using impedance-matched transmission lines as the metallic conductors.

20. The arrangement of claim 18, wherein:
the first wireless transceiver is operable to also wirelessly exchange at least one of status and control signals between the data-storage module and the second wireless transceiver; and
the second wireless transceivers is operable to also wirelessly exchange at least one of status and control signals between the I/O module and the first wireless transceiver.

21. The arrangement of claim 18, wherein the enclosure is an EMI-shielding type of enclosure.

22. The arrangement of claim 18, further comprising:
a power supply module; and
one of a cable harness and a connection-plane structure, each
connecting to the power supply module, the data-storage module and the I/O module, and
supplying power from the power supply module to the data-storage module and the I/O module, respectively.

23. The arrangement of claim 18, wherein the data-storage unit includes at least one of a disk-drive-based memory device; a tape-based memory device and a solid-state-based memory device.

24. The architecture of claim 18, wherein each transceiver includes a PCB-type antenna.

25. An intra-enclosure-wireless and inter-enclosure-wireless connection arrangement for a data-storage system, the arrangement comprising:
a first data-storage block including
a first enclosure,
first data-storage means provided within the first enclosure,
first input/output (I/O) means provided within the first enclosure, and
first wireless means for intra-first-enclosure wireless exchange of data between the first data-storage means and the first I/O means;
a second data-storage block including
a second enclosure,
second data-storage means provided within the second enclosure,
second input/output (I/O) means provided within the second enclosure, and
second wireless means for intra-second-enclosure wireless exchange of data between the second data-storage means and the second I/O means;
a cabinet that encloses the first and second data-storage blocks;
third wireless means, provided within the cabinet, for intra-cabinet albeit inter-enclosure wireless exchange of data between the first I/O means and third I/O means;
fourth wireless means, provided within the cabinet, for intra-cabinet albeit inter-enclosure wireless exchange of data between the second I/O means and the third I/O means; and
the third I/O means, which is operable to exchange data between an entity external to the first and second data-storage blocks and at least one of the third wireless means and the fourth wireless means.

26. The arrangement of claim 25, wherein the entity is also external to the cabinet.

* * * * *

UNITED STATES PATENT AND TRADEMARK OFFICE
CERTIFICATE OF CORRECTION

PATENT NO. : 7,260,358 B2 Page 1 of 1
APPLICATION NO. : 10/458250
DATED : August 21, 2007
INVENTOR(S) : James J deBlanc et al.

It is certified that error appears in the above-identified patent and that said Letters Patent is hereby corrected as shown below:

Title page, item (75), under "Inventors", in column 1, line 2, delete "Roseville, CA" and insert -- Fremont Center, NY --, therefor.

In column 6, line 35, in Claim 2, delete "it" and insert -- if --, therefor.

Signed and Sealed this

Fifteenth Day of July, 2008

JON W. DUDAS
*Director of the United States Patent and Trademark Office*